US007400986B2

(12) United States Patent
Latham et al.

(10) Patent No.: US 7,400,986 B2
(45) Date of Patent: Jul. 15, 2008

(54) USAGE MONITORING APPARATUS

(75) Inventors: Christopher Brian Taylor Latham, Grange-over-Sands (GB); Michael Craig Foster, Ulverston (GB)

(73) Assignee: Oxley Developments Company Limited, Ulverston Cumbria (GB)

( * ) Notice: Subject to any disclaimer, the term of this patent is extended or adjusted under 35 U.S.C. 154(b) by 0 days.

(21) Appl. No.: 11/354,580

(22) Filed: Feb. 15, 2006

(65) Prior Publication Data

US 2006/0195275 A1 Aug. 31, 2006

(30) Foreign Application Priority Data

Feb. 15, 2005 (GB) ................................ 0503079.6

(51) Int. Cl.
*G01R 33/04* (2006.01)

(52) U.S. Cl. ............................ 702/57; 702/61; 702/62; 702/60; 702/64; 702/65; 702/122; 324/110; 324/522; 361/60; 361/66; 361/42; 340/870.02; 340/870.21

(58) Field of Classification Search ................... 702/57, 702/60, 61, 62, 64, 65, 122; 340/870.02, 340/870.21; 324/110, 522; 361/42, 60, 66
See application file for complete search history.

(56) References Cited

U.S. PATENT DOCUMENTS 4,804,957 A 2/1989 Selph et al.
5,109,315 A * 4/1992 Morse ......................... 361/42
5,126,654 A * 6/1992 Murphy et al. ............. 324/71.2
5,185,705 A * 2/1993 Farrington .................. 700/292
5,301,122 A 4/1994 Halpern
5,471,144 A * 11/1995 Meyer ........................ 324/551

(Continued)

FOREIGN PATENT DOCUMENTS

EP 1041516 10/2000

(Continued)

OTHER PUBLICATIONS

European Search Report for European Application No. 06100407.3 mailed Nov. 2, 2007.

*Primary Examiner*—Carol S Tsai
(74) *Attorney, Agent, or Firm*—Meyertons, Hood, Kivlin, Kowert & Goetzel, P.C.; Eric B. Meyertons

(57) ABSTRACT

An apparatus is disclosed for monitoring usage of multiple electrical devices. The apparatus comprises multiple non-invasive current sensors for sensing current in respective conductors associated with the electrical devices. Such conductors may for example be the electrical power supply leads to the devices. The apparatus further includes multiple analogue to digital conversion functions for digitizing the output from the respective current sensors. A microprocessor is arranged to receive the digitized current sensor and is programmed to create usage data relating to the respective electrical devices. Such usage data may include cumulative elapsed running time. The microprocessor has an associated memory in which the usage data is stored in association with corresponding data identifying the electrical devices. The system further includes an interface through which the usage and identifier data are extractable, to provide usage information for the respective electrical devices. The apparatus may be divided into two separate sub-systems connected through a bus and it is particularly preferred that a sub-system incorporating the current sensors is mounted to, or otherwise associated with, a power distribution unit.

7 Claims, 1 Drawing Sheet

U.S. PATENT DOCUMENTS

| | | | | |
|---|---|---|---|---|
| 6,330,516 | B1 * | 12/2001 | Kammeter | 702/60 |
| 6,671,635 | B1 * | 12/2003 | Forth et al. | 702/61 |
| 7,221,142 | B2 * | 5/2007 | Murray et al. | 324/117 R |
| 2002/0042683 | A1 * | 4/2002 | Shincovich | 702/61 |
| 2006/0007016 | A1 * | 1/2006 | Borkowski et al. | 340/870.02 |
| 2006/0238932 | A1 * | 10/2006 | Westbrock, Jr. et al. | 361/42 |
| 2006/0241880 | A1 * | 10/2006 | Forth et al. | 702/60 |

FOREIGN PATENT DOCUMENTS

| | | |
|---|---|---|
| GB | 2142172 | 1/1985 |
| GB | 2342998 | 4/2000 |

* cited by examiner

USAGE MONITORING APPARATUS

BACKGROUND OF THE INVENTION

1. Field of the Invention

The present invention relates to apparatus for monitoring usage of multiple electrical devices.

2. Description of the Relevant Art

Monitoring of usage of electrical equipment is often desirable to ensure that servicing or replacement is carried out at the proper time, and also for warranty purposes. Defense equipment, whose reliability may be safety critical, is an important case in point. Elapsed time indicators (ETIs) which connect electrically to the electrical supply of a piece of equipment and which contain an elapsed time counter, typically driven from the equipment's electrical supply, are in themselves well known. They may have an integral display or may, as exemplified in Oxley (Development) Co. Ltd's European Patent Application 00302679.6, have an interface for interrogation by a separate unit. The ETI described in that patent application monitors a single power supply, the elapsed time counter being activated when power is down by the host device.

Such simple ETIs are not well suited where multiple separate electrical devices or electrical sub-systems all require monitoring. One example of such a situation, of particular relevance for present purposes, is provided by the communications apparatus of a military vehicle, which may comprise multiple different systems including UHF radio, HF radio, ancillary equipment etc each requiring independent usage monitoring. Multiple separate ETIs, each associated with respective systems, would not be appropriate.

Oxley (Development) Co. Ltd's UK patent GB 2142172 describes a system in which for each electrical device to be monitored there would be a respective non-volatile memory device and interface circuit, connected to the electrical device's and adapted to maintain its own cumulative record of host running time, but several such devices would be connected via a data bus to a common control unit having a display and user controls. Connection of the multiple separate monitoring devices could still prove problematic in some contexts.

The requirement of such ETIs for an electrical connection to the supply of each device being monitored can be a drawback, giving rise to its own concerns over reliability (in safety critical systems, the possibility that the ETI might itself compromise reliability of the system being maintained is desirably to be avoided) and creating potential installation problems, particularly where the usage monitoring system is to be "retro fitted" to an existing piece of equipment.

SUMMARY OF THE INVENTION

In one embodiment, there is an apparatus for monitoring usage of multiple electrical devices, the apparatus including multiple non-invasive current sensors for sensing current in respective conductors associated with the electrical devices, an analogue to digital conversion function for digitizing the output from the respective current sensors, a microprocessor and associated memory arranged and adapted to receive the digitized current sensor data and use it to create usage data specific to the respective electrical devices and to store the usage data in association with corresponding electrical device identifier data, and an interface through which the usage and identifier data are extractable to provide usage information for the respective electrical devices.

It is particularly preferred that creation of the usage data involves creating a cumulative record of elapsed activation time for one or more of the electrical devices. An elapsed time counter may be activated in response to current above a threshold value.

The determination of whether the electrical device is active is preferably carried out by the microprocessor, based upon the current sensor data. Consequently criteria for determining whether the devices are active can be stored in memory. These criteria may thus be chosen for the particular device in question, and may be different for different devices. Such criteria may simply take the form of threshold current values, above which the relevant electrical device is considered to be active.

It is particularly preferred that the apparatus is divided physically into two separate sub-systems which communicate through a digital bus. A first sub-system includes at least the current sensors and the analogue to digital conversion functions. Its position is likely to be dictated by that of the conductors being monitored. A second sub-system includes at least the interface and can be mounted in a user accessible position. It is particularly preferred that the first sub-system is associated with a power distribution unit, the current sensors being arranged to monitor currents supplied by the power distribution unit to the electrical devices through power supply lines.

It is further preferred that the microprocessor and memory are part of the second sub-system, the bus carrying the digitized current sensor data.

BRIEF DESCRIPTION OF THE DRAWINGS

Specific embodiments of the present invention will now be described, by way of example only, with reference to the accompanying drawings, in which.

Figure 1:
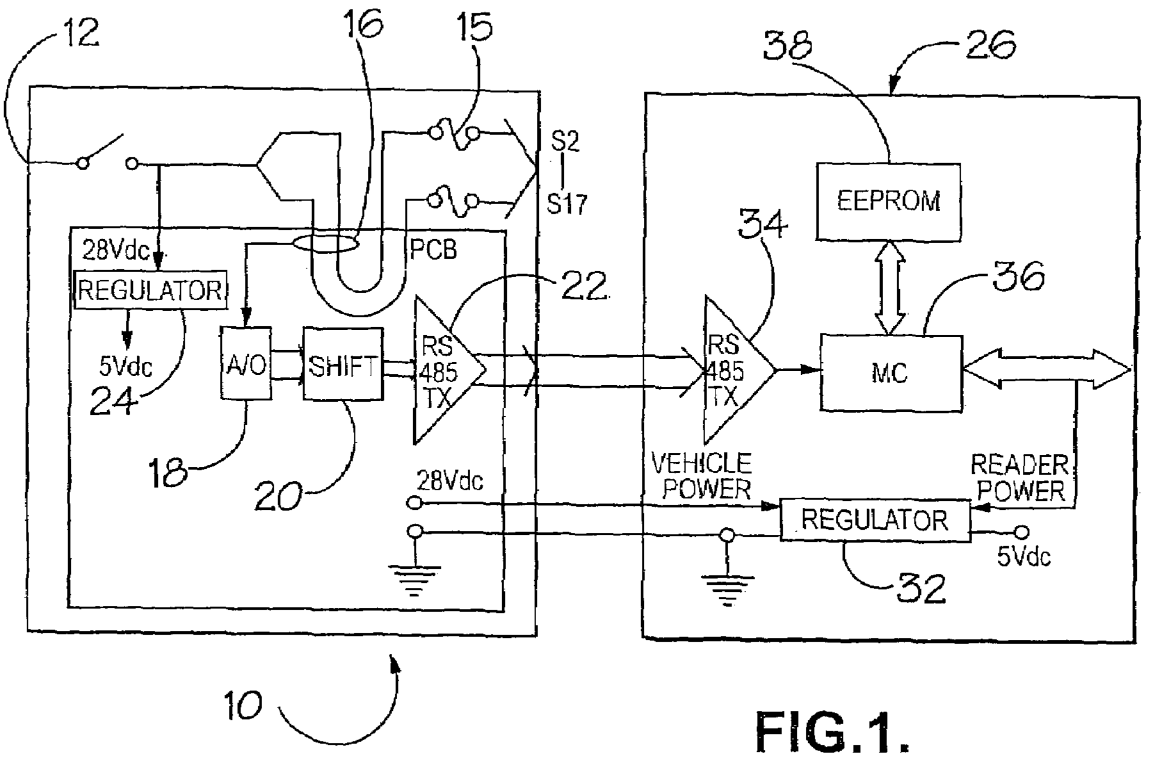
FIG. 1 is a block diagram of a usage monitoring system embodying the present invention.
Figure 2:
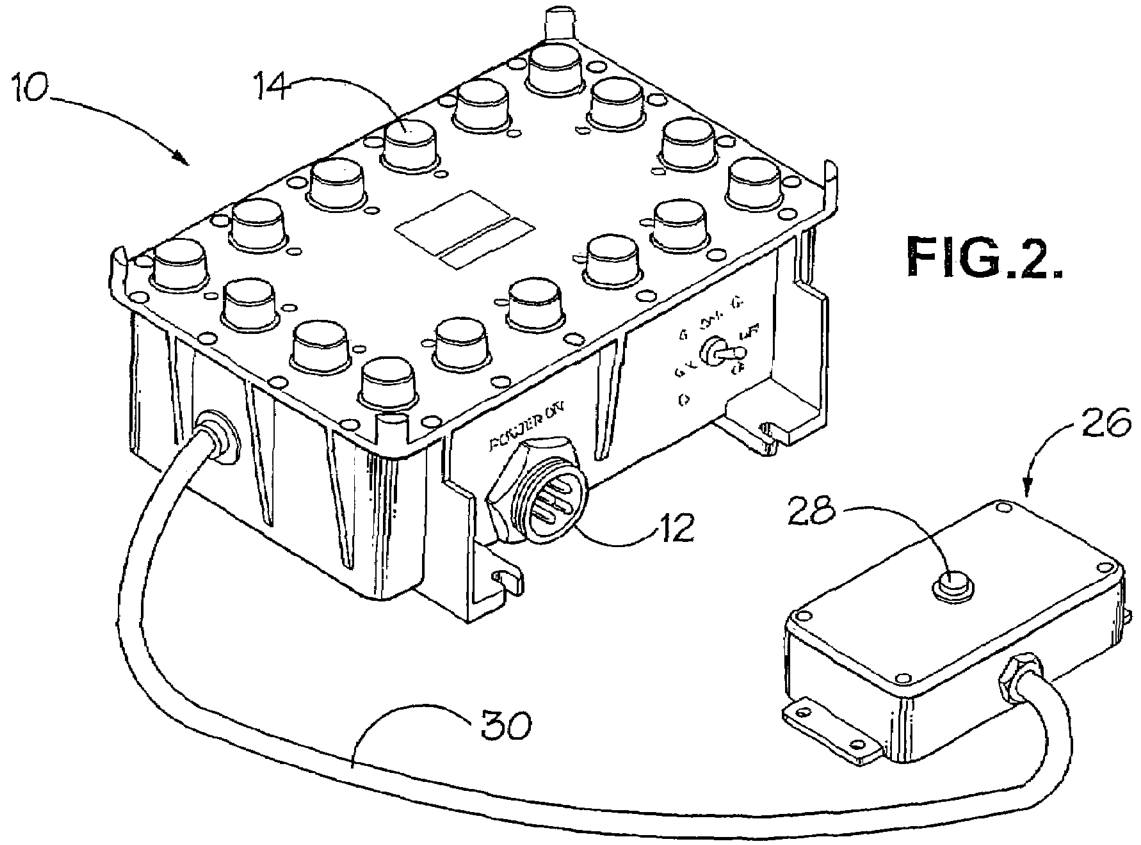
FIG. 2 is a perspective illustration of a power distribution system fitted with the usage monitoring system.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The illustrated system monitors usage of multiple electrical systems or sub-systems by monitoring current supplied to them from a common power distribution unit (PDU) 10. The present system is able to monitor sixteen systems. The illustrated PDU is used in a military vehicle. It connects to the vehicle power supply through a socket 12 and distributes power through lines S2 to S17 to various sub-systems of the vehicle's communications apparatus. The PDU's conventional purpose is to provide each sub-system with protection against excess current and the illustrated device provides this function through conventional excess current trip circuitry 15 with associated indicator lamps 14 at the PDU's exterior.

Also mounted within the PDU, in one embodiment, are non-invasive current monitoring devices such as 16, each associated with a respective power supply S2-S17. Various types of non-invasive current monitoring devices are known in the art, and can be used for sensing alternating or direct currents. Different embodiments of the present invention may be used for monitoring of either AC or DC supplies. Where the supply is AC, a simple inductive loop, formed by coils of conductor around the supply line, may be used to create a detectable EMF. Alternatively the monitoring device 16 may function by sensing the magnetic field associated with current flow through the supply line, this method being favored where the supply is DC. In the present embodiment the device 16 uses a Hall effect generator to detect the magnetic field, the magnetic flux applied to it being increased by placing the Hall effect generator in an air gap of a ferrous toroid surrounding the supply line. U.S. Pat. No. 5,416,407, which is incorporated herein by reference, describes such a device.

No direct electrical connection to the supply line is required. Instead the relevant part of the monitoring device 16 need only be placed around, or adjacent to, the supply line.

The output from the monitoring devices 16 may be fed to conditioning circuitry such as a differential amplifier. The result is a voltage modulated signal from each of the monitoring devices 16, and each signal is supplied to a respective channel of an analogue to digital (A/D) evaluator 18, which in its turn supplies a corresponding set of digital signals to a shift register 20. This data is serialized at 22 and output to a data bus in a conventional format such as RS485. The digital electronics mounted in the PDU are powered from the vehicle's supply (which is 28V DC) through a regulator 24 providing a suitable 5V DC output.

The electronics so far described are mounted in or on the PDU 10. They serve to output a digital signal containing current data for each of the lines S2-S17 being monitored. The system further includes a separate unit 26 referred to herein as the data provision unit because it carries an interrogation point 28, to be described below, through which data can be extracted. The PDU-mounted electronics connect to the data provision unit 26 through a cable 30 which serves as the serial data bus and which also carries a power 28V DC power supply to the data provision unit. Once more this is stepped down to 5V DC by means of a regulator 32 suitably to drive the electronics. The current monitoring data is input via serial port 34 to a microprocessor 36 provided with non volatile data storage 38 which in the present embodiment is formed as an EEPROM (electrically erasable programmable read only memory). The microprocessor 36 is also provided with an interface through which data can be exchanged with an external interrogation device. In the present exemplary embodiment this includes the interrogation point 28, which has two concentric circular electrical contacts against which complementary contacts of the reader are placed to form the necessary electrical connection.

The microprocessor monitors each current sensing channel and creates for each a usage record. This can be done by selecting a threshold current value below which the corresponding device is taken to be inactive and above which it is considered active. A cumulative record of elapsed active time is maintained for each channel. Other data such as the number of activations can also be recorded.

Additionally data relevant to the electrical apparatus being monitored may be stored. Such data will typically include a serial number for the apparatus. In the present embodiment it additionally includes the threshold current value to be used in the elapsed time function, since the different pieces of apparatus being monitored draw different currents when active. Other data, such as details of the equipment's previous service history, could be stored.

Interrogation can be carried out by using a portable device such as a lap, or palm-top computer with suitable two contact interface. Data can also be written to the non-volatile storage 38 in this manner, so that for example the elapsed time counters can be reset when necessary, service histories can be updated and serial numbers associated with particular channels can be modified following re-configuration of vehicle wiring.

In this patent, certain U.S. patents, U.S. patent applications, and other materials (e.g., articles) have been incorporated by reference. The text of such U.S. patents, U.S. patent applications, and other materials is, however, only incorporated by reference to the extent that no conflict exists between such text and the other statements and drawings set forth herein. In the event of such conflict, then any such conflicting text in such incorporated by reference U.S. patents, U.S. patent applications, and other materials is specifically not incorporated by reference in this patent.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description to the invention. Changes may be made in the elements described herein without departing from the spirit and scope of the invention as described in the following claims. In addition, it is to be understood that features described herein independently may, in certain embodiments, be combined.

What is claimed is:

1. An apparatus for monitoring usage of multiple electrical devices, the apparatus comprising multiple non-invasive current sensors for sensing current in respective conductors associated with the electrical devices, multiple analogue to digital conversion functions for digitizing the output from the respective current sensors, a microprocessor with an associated memory arranged and adapted to determine which of the electrical devices is active based upon the digitized current sensor output by determining whether the current in a relevant conductor is above a threshold value, to activate an elapsed time counter while the device corresponding to the relevant conductor is determined to be active, and to store a record of elapsed activation time in association with identifier data for the corresponding device, and an interface through which the stored record data and identifier data are extractable to provide usage information for the respective electrical devices.

2. The apparatus of claim 1, wherein criteria for determining whether each electrical device is active are stored in memory, giving the facility for different criteria to be applied for different electrical devices.

3. The apparatus of claim 2, wherein the criteria comprise threshold current values.

4. The apparatus of claim 1 wherein the microprocessor is provided with non-volatile memory in which the usage data is stored.

5. The apparatus of claim 1, further comprising first and second physically separate sub-systems which communicate through a digital bus, the first sub-system comprising at least the current sensors and the analogue to digital conversion functions, and the second sub-system comprising at least the interface.

6. The apparatus of claim 5 wherein the first sub-system is mounted to or otherwise associated with a power distribution unit, the current sensors being arranged to monitor currents supplied by the power distribution unit to the electrical devices through power supply lines.

7. The apparatus of claim 6 wherein the microprocessor and memory are part of the second sub-system, the bus comprising the digitized current sensor data.

* * * * *